US010566253B2

(12) United States Patent
Chang et al.

(10) Patent No.: US 10,566,253 B2
(45) Date of Patent: Feb. 18, 2020

(54) ELECTRONIC DEVICE AND ELECTRICAL TESTING METHOD THEREOF

(71) Applicant: NANYA TECHNOLOGY CORPORATION, New Taipei (TW)

(72) Inventors: Chih-Ying Chang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 58 days.

(21) Appl. No.: 15/918,321

(22) Filed: Mar. 12, 2018

(65) Prior Publication Data

US 2019/0164849 A1  May 30, 2019

Related U.S. Application Data

(60) Provisional application No. 62/592,901, filed on Nov. 30, 2017.

(51) Int. Cl.
| | | |
|---|---|---|
| *G01R 31/28* | (2006.01) | |
| *H01L 21/66* | (2006.01) | |
| *H01L 23/525* | (2006.01) | |
| *H01L 23/528* | (2006.01) | |
| *G01R 31/07* | (2006.01) | |
| *H01L 21/8234* | (2006.01) | |

(52) U.S. Cl.
CPC ............. *H01L 22/14* (2013.01); *G01R 31/07* (2013.01); *G01R 31/2831* (2013.01); *H01L 22/34* (2013.01); *H01L 23/528* (2013.01); *H01L 23/5252* (2013.01); *H01L 21/823475* (2013.01)

(58) Field of Classification Search
CPC ..... H01L 22/14; H01L 22/34; G01R 31/2831; G01R 31/07
See application file for complete search history.

(56) References Cited

U.S. PATENT DOCUMENTS

| | | | | |
|---|---|---|---|---|
| 5,679,974 A | * | 10/1997 | Shinriki | ............. H01L 23/5252 257/530 |
| 6,570,207 B2 | * | 5/2003 | Hsu | ..................... H01L 23/5252 257/302 |
| 7,534,722 B2 | | 5/2009 | Trezza | |
| 8,476,735 B2 | * | 7/2013 | Hsu | ................... H01L 21/76886 257/528 |
| 8,896,092 B2 | * | 11/2014 | Takeshima | .......... H01L 23/5252 257/530 |
| 2002/0075743 A1 | * | 6/2002 | Ooishi | ................... G11C 29/70 365/225.7 |

(Continued)

FOREIGN PATENT DOCUMENTS

| | | |
|---|---|---|
| TW | 201224464 A | 6/2012 |
| TW | 201232548 A | 8/2012 |
| TW | 201543492 A | 11/2015 |

*Primary Examiner* — Dominic E Hawkins
(74) *Attorney, Agent, or Firm* — Muncy, Geissler, Olds & Lowe, P.C.

(57) ABSTRACT

An electronic device includes a substrate, an electronic component disposed over the substrate and an electrical testing component disposed over the substrate. The electronic component includes a bottom plate over the substrate, and a top plate over the bottom plate. The electrical testing component includes a first anti-fuse structure and a second anti-fuse structure, wherein the first anti-fuse structure and the second anti-fuse structure are electrically connected to the bottom plate.

7 Claims, 6 Drawing Sheets

(56) References Cited

U.S. PATENT DOCUMENTS

| | | | |
|---|---|---|---|
| 2003/0173643 A1* | 9/2003 | Herner | H01L 23/5252 257/530 |
| 2009/0294903 A1* | 12/2009 | Shih | H01L 23/5252 257/530 |
| 2010/0230781 A1* | 9/2010 | Booth, Jr. | H01L 23/5252 257/530 |
| 2012/0126365 A1* | 5/2012 | Tani | H01L 23/5252 257/530 |
| 2015/0130506 A1* | 5/2015 | Bhunia | G11C 17/16 326/8 |
| 2017/0133288 A1* | 5/2017 | Baek | H01L 24/16 |
| 2017/0186734 A1 | 6/2017 | Kim | |

* cited by examiner

ELECTRONIC DEVICE AND ELECTRICAL TESTING METHOD THEREOF

PRIORITY CLAIM AND CROSS-REFERENCE

This application claims priority of U.S. provisional application Ser. No. 62/592,901, filed on Nov. 30, 2017, which is incorporated herein by reference in its entirety.

TECHNICAL FIELD

The present disclosure relates to an electronic device and an electrical testing method thereof, and more particularly, to an electronic device incorporating anti-fuse structures as testing components, and an electrical testing method thereof.

DISCUSSION OF THE BACKGROUND

In integrated circuit fabrication, millions or more of electronic components are integrally formed over a wafer. In some cases, a few of the electronic components in the wafer may fail, and thus cannot function normally. In conventional integrated circuit fabrication, the electronic components cannot be electrically tested until back end of line (BEOL) routing is accomplished. This results in high waste due to having to abort the entire wafer or chip since additional processes are performed before errors are detected.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides an electronic device. The electronic device includes a substrate, an electronic component disposed over the substrate and an electrical testing component disposed over the substrate. The electronic component includes a bottom plate over the substrate, and a top plate over the bottom plate. The electrical testing component is fusible in order to be selectively electrically connected to the bottom plate of the electronic component.

In some embodiments, the electrical testing component comprises a first anti-fuse structure and a second anti-fuse structure, and the first anti-fuse structure and the second anti-fuse structure are fusible in order to be electrically connected to the bottom plate.

In some embodiments, the electronic component further includes a dielectric layer between the bottom plate and the top plate, and a plurality of capacitor electrodes in the dielectric layer, wherein the plurality of capacitor electrodes are electrically connected to the bottom plate and the top plate.

In some embodiments, the first anti-fuse structure includes a first bottom electrode over the substrate and electrically connected to the bottom plate, a first top electrode penetrating the dielectric layer, and a first contact pad disposed over the dielectric layer and electrically connected to the first top electrode.

In some embodiments, the second anti-fuse structure includes a second bottom electrode over the substrate and electrically connected to the bottom plate, a second top electrode penetrating the dielectric layer, and a second contact pad disposed over the dielectric layer and electrically connected to the second top electrode.

In some embodiments, the first bottom electrode of the first anti-fuse structure, the second bottom electrode of the second anti-fuse structure and the bottom plate of the electronic component are formed from a first conductive layer.

In some embodiments, the first top electrode of the first anti-fuse structure, the second top electrode of the second anti-fuse structure and the capacitor electrodes of the electronic component are formed from a second conductive layer.

In some embodiments, the first contact pad of the first anti-fuse structure, the second contact pad of the second anti-fuse structure and the top plate of the electronic component are formed from a third conductive layer.

In some embodiments, the electronic device further includes a dielectric film disposed between the bottom plate and the dielectric layer.

In some embodiments, the dielectric film is ruptured such that the first top electrode is electrically connected to the first bottom electrode, and the second top electrode is electrically connected to the second bottom electrode.

One aspect of the present disclosure provides an electric testing method. The electric testing method includes the following processes. An electronic device is provided. The electronic device includes an electronic component and an electrical testing component. The electronic component includes a bottom plate, and a top plate over the bottom plate. The electrical testing component includes a first anti-fuse structure and a second anti-fuse structure. A first voltage is applied to the first anti-fuse structure and a second voltage is applied to the second anti-fuse structure to electrically connect the first anti-fuse structure and the second anti-fuse structure to the bottom plate. The electronic component is tested by applying a third voltage to one of the first anti-fuse structure and the second anti-fuse structure and a fourth voltage to the top plate.

In some embodiments of the present disclosure, the electrical testing component can be selectively enabled to create an electrical connection to the underlying bottom plate of the electronic component. The electrical testing component allows the electronic component to be tested in advance before the through vias are formed during BEOL processes. Therefore, a repairing process can be performed to repair the electronic component if the electronic component is detected to be faulty. Alternatively, the electronic component can be scrapped without performing subsequent BEOL processes and package processes. In either case, the manufacturing costs of the electronic device can be reduced.

In contrast, with conventional integrated circuit fabrication methods, the electronic device cannot be tested until the through vias are formed during BEOL processes. After the BEOL processes are completed, it is difficult to repair the electronic component. Accordingly, the manufacturing costs are increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
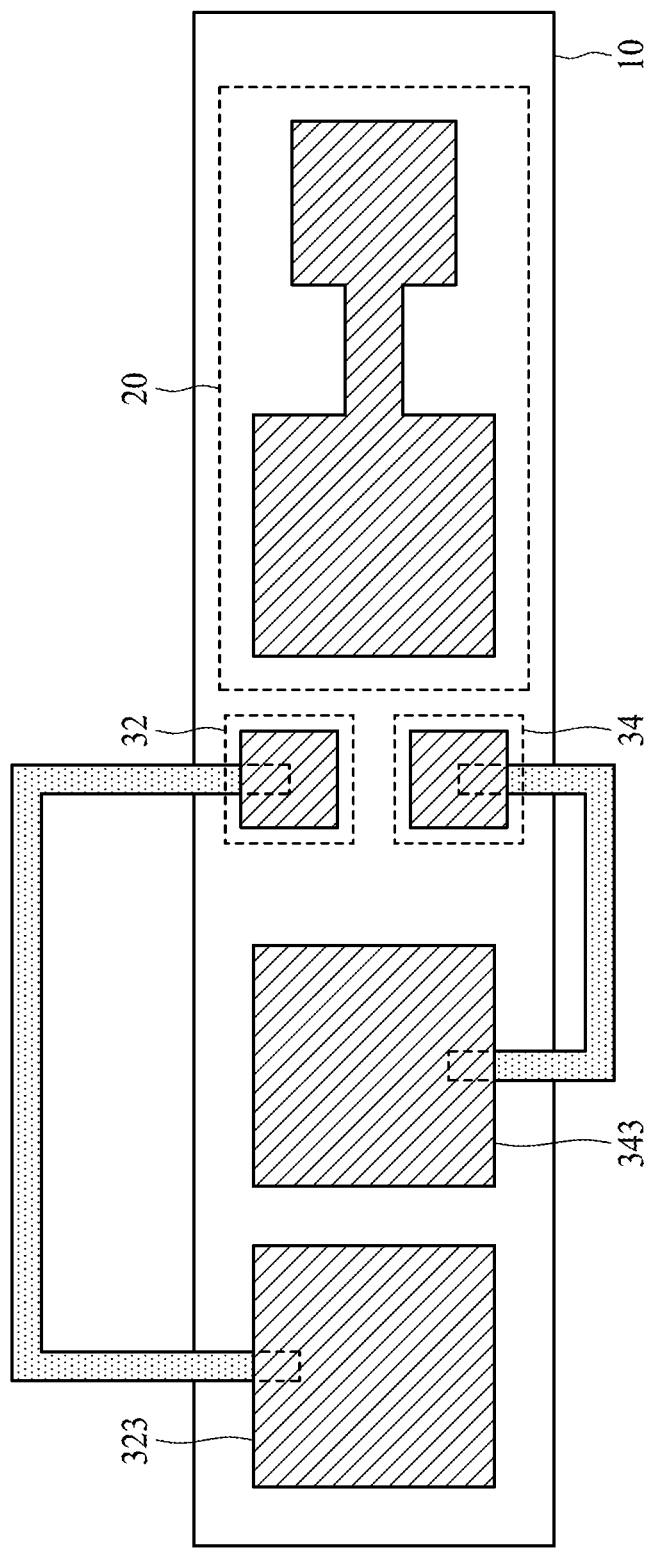
FIG. 1 is a schematic diagram illustrating an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "anti-fuse" refers to a semiconductor device which is a normally open circuit. The anti-fuse can be fused to be a short circuit when a programming voltage is applied.

Figure 2:
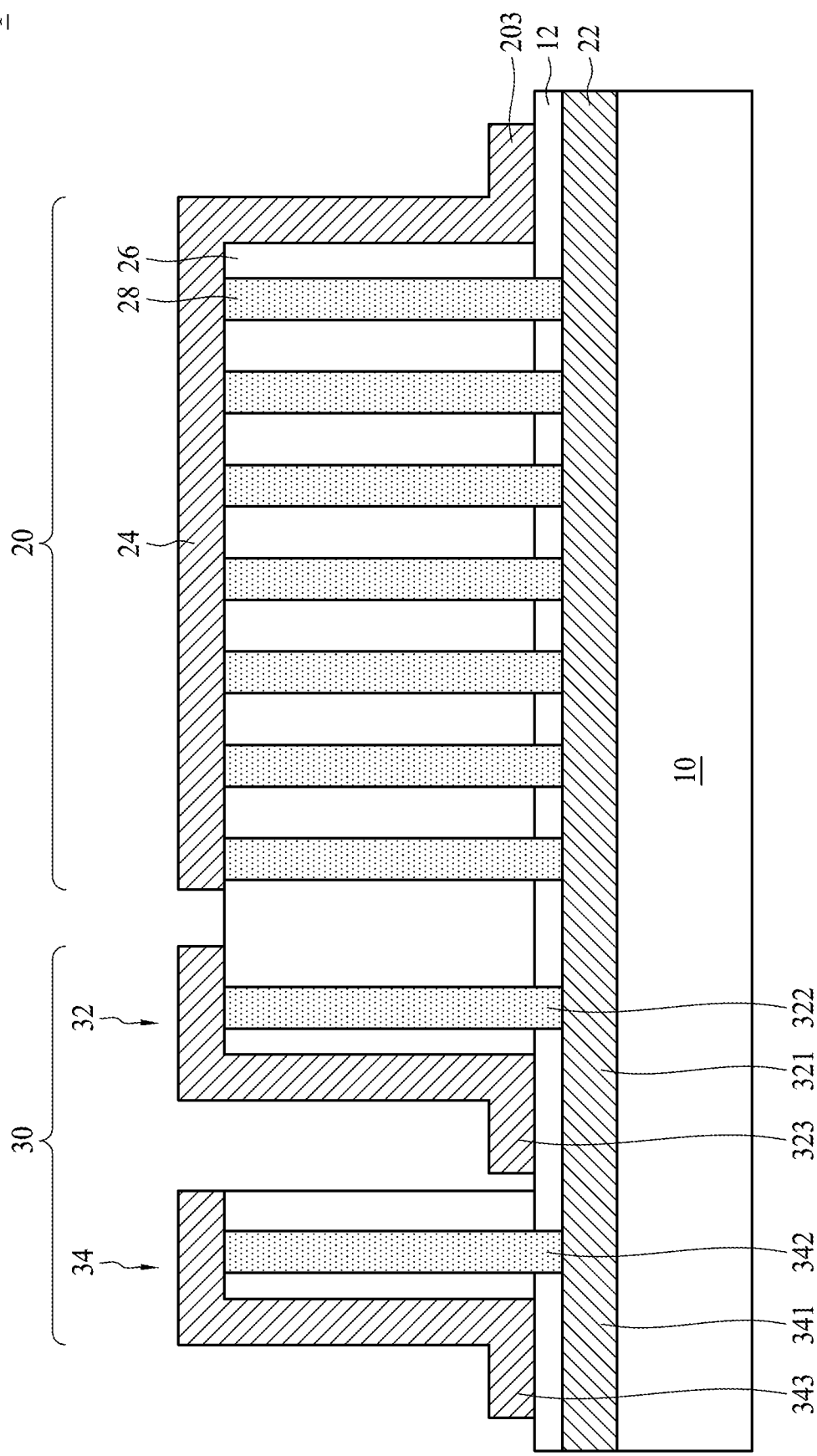
FIG. 2 is a schematic cross-sectional view illustrating an electronic device in accordance with some embodiments of the present disclosure.

FIG. 1 is a schematic diagram illustrating an electronic device in accordance with some embodiments of the present disclosure, and FIG. 2 is a schematic cross-sectional view illustrating an electronic device in accordance with some embodiments of the present disclosure. As shown in FIG. 1 and FIG. 2, the electronic device 1 includes a substrate 10, an electronic component 20 and an electrical testing component 30. In some embodiments, the substrate 10 may include a semiconductor substrate such as a silicon substrate. In some embodiments, semiconductor components such as transistors may be formed in the substrate 10 or over the substrate 10. The electronic component 20 is disposed over the substrate 10. The electronic component 20 may include a bottom plate 22 disposed over the substrate 10, and a top plate 24 over the bottom plate 22. The electrical testing component 30 is disposed over the substrate 10. The electrical testing component 30 is fusible in order to be selectively electrically connected to the bottom plate 22 of the electronic component 20. The electrical testing component 30 may include a first anti-fuse structure 32 and a second anti-fuse structure 34. The first anti-fuse structure 32 and the second anti-fuse structure 34 may be fusible in order to be electrically connected to the bottom plate 22. In some embodiments, the first anti-fuse structure 32 and the second anti-fuse structure 34 may include capacitive anti-fuse structures, but the present disclosure is not limited thereto. For example, the first anti-fuse structure 32 and the second anti-fuse structure 34 may include gate oxide (GOX) anti-fuse structures or other types of anti-fuse structures.

In some embodiments, the electronic component 20 may include a memory cell, but the present disclosure is not limited thereto. In some embodiments, the electronic component 20 may further include a dielectric layer 26 and a plurality of capacitor electrodes 28. In some embodiments, the dielectric layer 26 is disposed between the bottom plate 22 and the top plate 24. In some embodiments, the capacitor electrodes 28 are at least partially disposed in the dielectric layer 26 and electrically connected to the bottom plate 22 and the top plate 24. In some embodiments, each of the capacitor electrodes 28 may include two conductors isolated by a dielectric material such that one of the conductors is electrically connected to the bottom plate 24, and the other one of the conductors is electrically connected to the top electrode 24. In some embodiments, the electronic component 20 may further include a contact pad 203 connected to the top plate 24.

In some embodiments, the electronic device 1 may further include a dielectric film 12 disposed between the bottom plate 22 and the dielectric layer 26. In some embodiments, the capacitor electrodes 28 penetrate the dielectric film 12, and are electrically connected to the bottom plate 24.

In some embodiments, the first anti-fuse structure 32 may include a first bottom electrode 321, a first top electrode 322 and a first contact pad 323. In some exemplary embodiments, the first bottom electrode 321 is disposed over the substrate 10 and is electrically connected to the bottom plate 22 of the electronic component 20. In some exemplary embodiments, the first top electrode 322 penetrates the dielectric layer 26. In some exemplary embodiments, the first contact pad 323 is disposed over the dielectric layer 26 and is electrically connected to the first top electrode 322.

In some embodiments, the second anti-fuse structure 34 may include a second bottom electrode 341, a second top electrode 342 and a second contact pad 343. In some exemplary embodiments, the second bottom electrode 341 is disposed over the substrate 10 and is electrically connected to the bottom plate 22. In some exemplary embodiments, the second top electrode 342 penetrates the dielectric layer 26. In some exemplary embodiments, the second contact pad 343 is disposed over the dielectric layer 26 and is electrically connected to the second top electrode 342.

In some embodiments, the electronic component 20 and the electrical testing component 30 can be integrally formed. By way of example, the first bottom electrode 321 of the first anti-fuse structure 32, the second bottom electrode 341 of the second anti-fuse structure 34 and the bottom plate 22 of the electronic component 20 can be formed from the same conductive layer such as a first conductive layer. The first top electrode 322 of the first anti-fuse structure 32, the second top electrode 342 of the second anti-fuse structure 34 and the capacitor electrodes 28 of the electronic component 20 can be formed from the same conductive layer such as a second conductive layer. The first contact pad 323 of the first anti-fuse structure 32, the second contact pad 343 of the second anti-fuse structure 34, and the top plate 24 and the contact pad 203 of the electronic component 20 can be formed from the same conductive layer such as a third conductive layer.

The electronic device 1 may further include a back end of line (BEOL) routing structure (not shown) over the electronic component 20. An electrical testing may be performed before the BEOL routing is formed.

Figure 3:
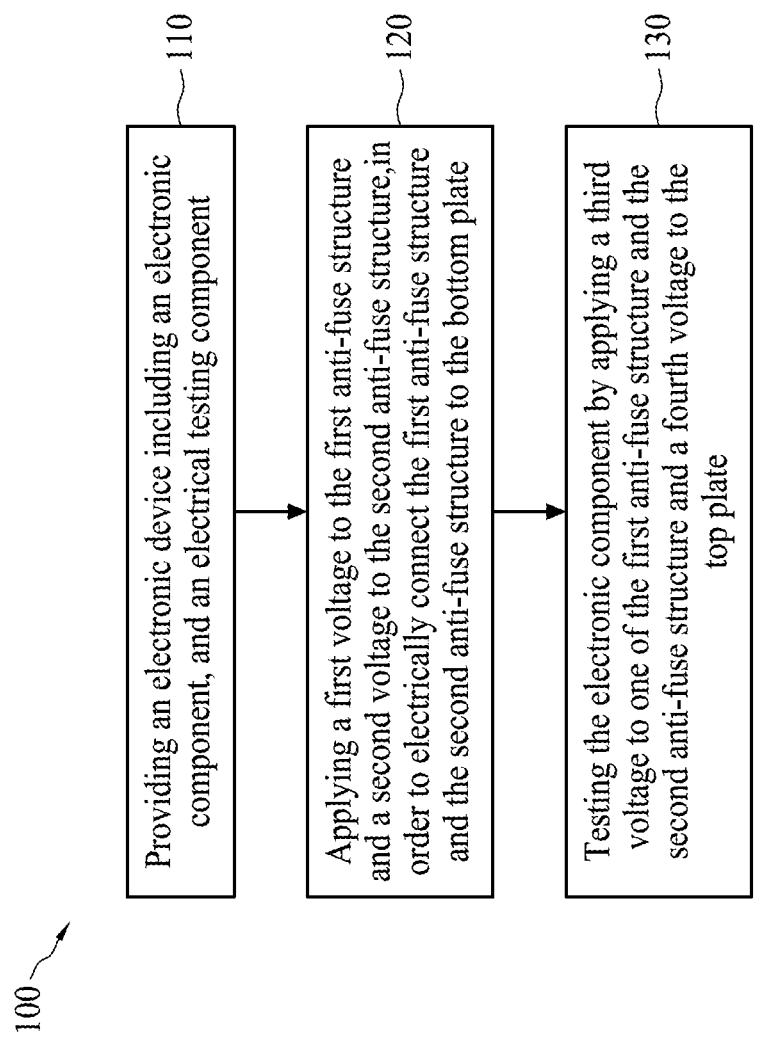
FIG. 3 is a flow chart illustrating an electrical testing method in accordance with some embodiments of the present disclosure.

FIG. 3 is a flow chart illustrating an electrical testing method in accordance with some embodiments of the present disclosure. As shown in FIG. 3, the electrical testing method 100 begins with a step 110, in which an electronic device, including an electronic component and an electrical testing component as illustrated in FIG. 1 and FIG. 2, is provided. The electrical testing method 100 proceeds with a step 120 in which a first voltage is applied to the first anti-fuse structure and a second voltage is applied to the second anti-fuse structure in order to electrically connect the first anti-fuse structure and the second anti-fuse structure to the bottom plate. The electrical testing method 100 proceeds with a step 130 in which the electronic component is tested by applying a third voltage to one of the first anti-fuse structure and the second anti-fuse structure and a fourth voltage to the top plate.

The electrical testing method 100 is merely an example, and is not intended to limit the present disclosure beyond what is explicitly recited in the claims. Additional steps can be provided before, during, and after the electrical testing method 100, and some operations described can be replaced, eliminated, or moved around for additional embodiments of the method.

Figure 4:
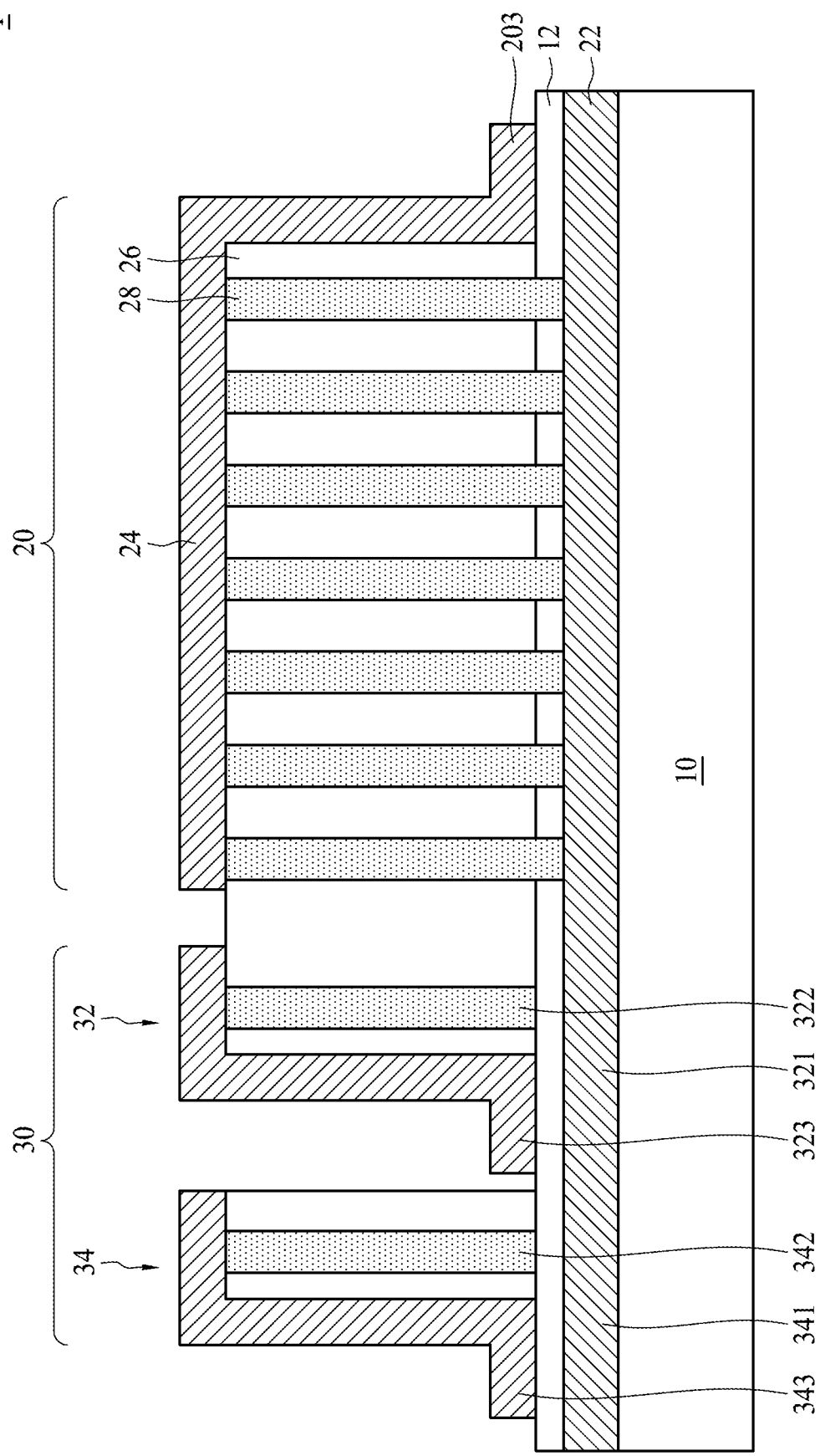
FIG. 4, FIG. 5 and FIG. 6 are schematic diagrams illustrating one or more steps of an electrical testing method in accordance with some embodiments of the present disclosure.
Figure 5:
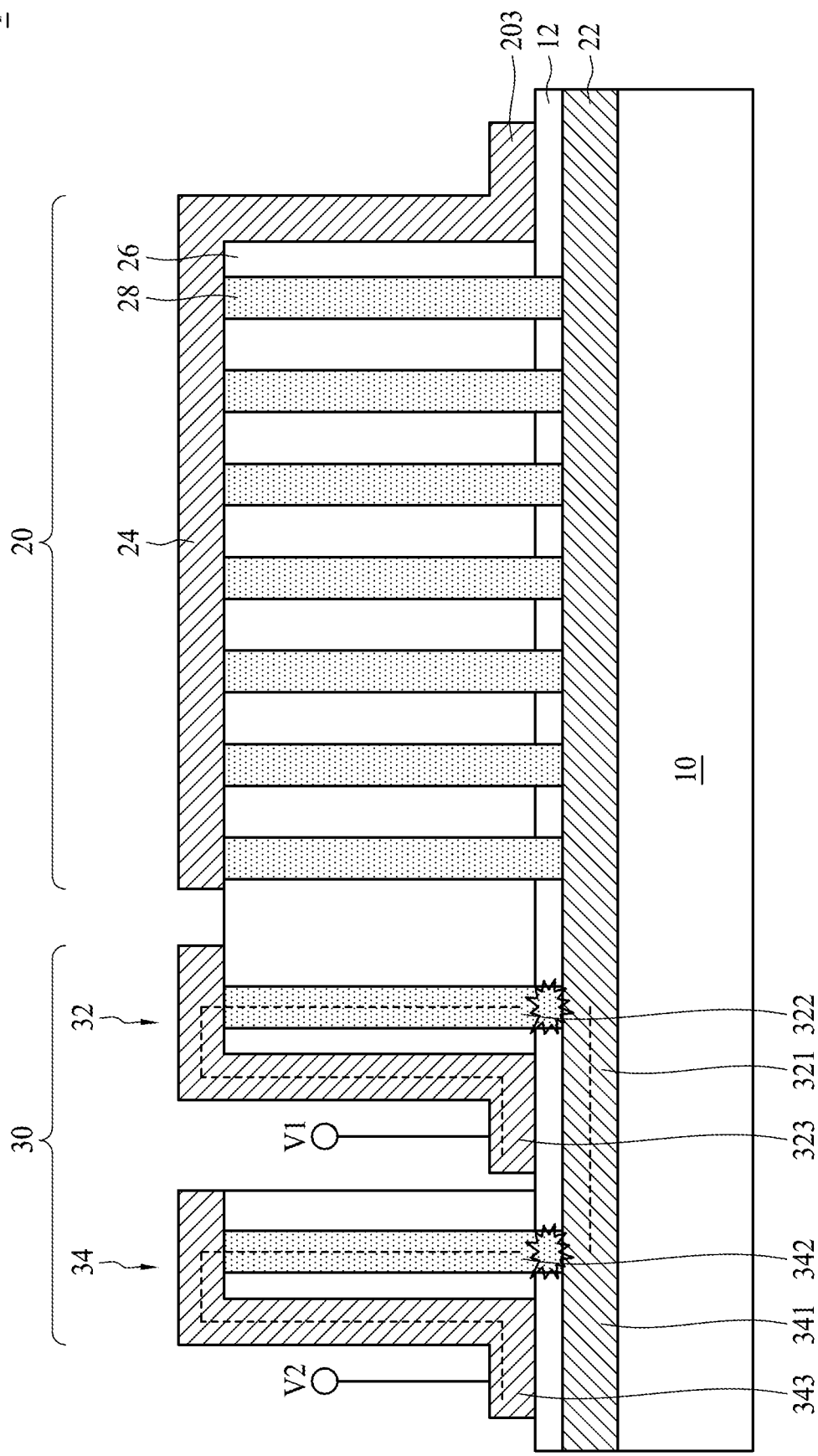
Figure 6:
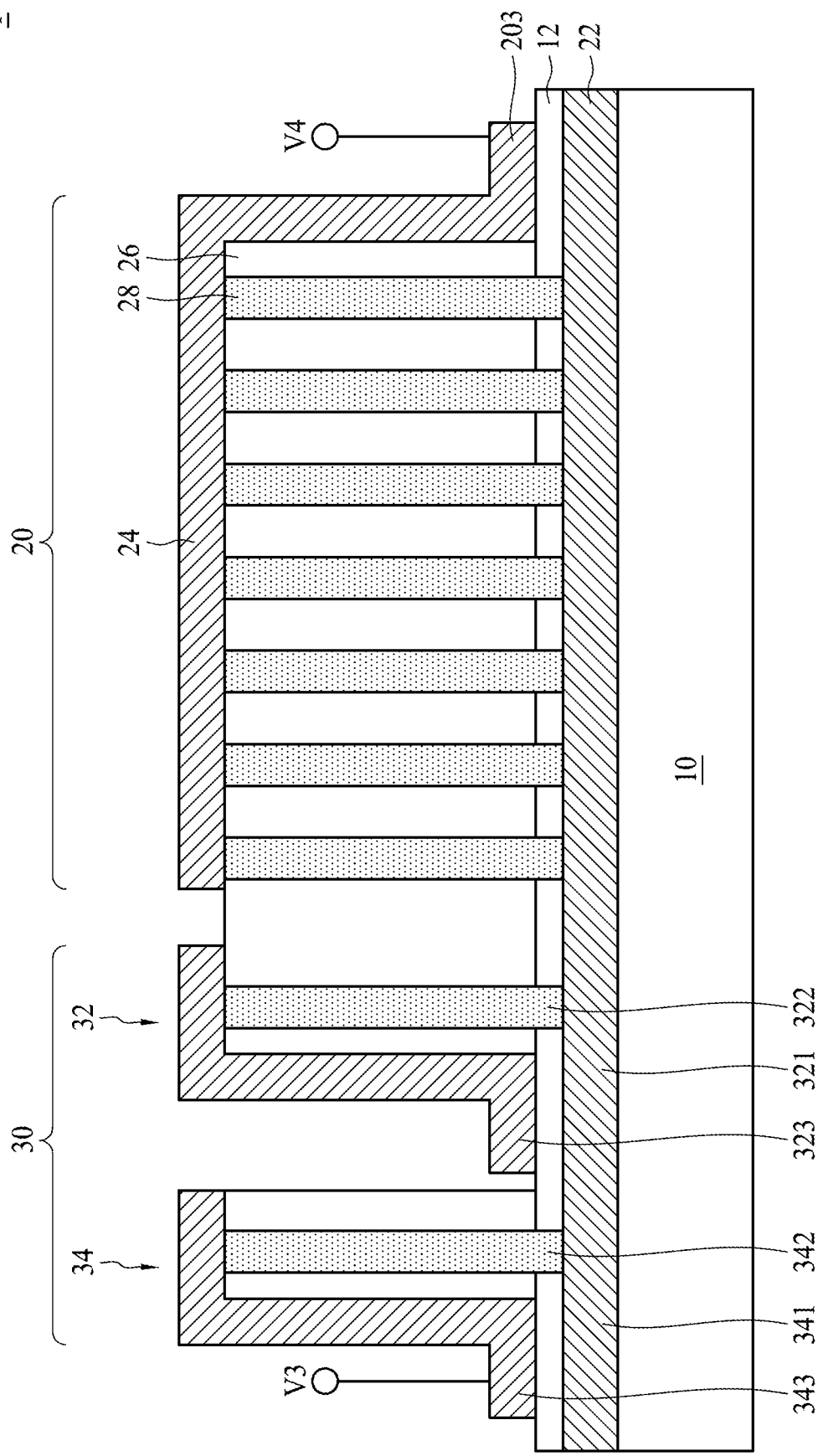

FIG. 4, FIG. 5 and FIG. 6 are schematic diagrams illustrating one or more steps of an electrical testing method in accordance with some embodiments of the present disclosure. As shown in FIG. 4, the electronic device 1, including the electronic component 20 and the electrical testing component 30 as illustrated in FIG. 1 and FIG. 2, is provided. In some embodiments, the first anti-fuse structure 32 and the second anti-fuse structure 34 are not fused. The first bottom electrode 321 and the first top electrode 322 of the first anti-fuse structure 32 are isolated by the dielectric film 12. The second bottom electrode 341 and the second top electrode 342 of the second anti-fuse structure 34 are isolated by the dielectric film 12.

As shown in FIG. 5, a first voltage V1 is applied to the first anti-fuse structure 32 through the first contact pad 323, and a second voltage V2 is applied to the second anti-fuse structure 34 through the second contact pad 343. The difference between the first voltage V1 and the second voltage V2 is greater than the programming potential. Consequently, the dielectric film 12 is ruptured such that the first top electrode 322 is electrically connected to the first bottom electrode 321, and the second top electrode 342 is electrically connected to the second bottom electrode 341. As shown by the dotted line, current can flow from the first contact pad 323 to the second contact pad 343. Accordingly, the first anti-fuse structure 32 and the second anti-fuse structure 34 can be electrically connected to the bottom plate 22 of the electronic component 20.

As shown in FIG. 6, the electronic component 20 is tested by applying a third voltage V3 to one of the first anti-fuse structure 32 and the second anti-fuse structure 34 and a fourth voltage V4 to the top plate 24. In some embodiments, the electrical testing may include a wafer acceptable test (WAT) to obtain necessary WAT data such as data line (DL) and word line (WL) resistance and cell capacitance for array structure learning. If the electronic component 20 is detected to be acceptable, subsequent BEOL processes and package processes can be performed. If the electronic component 20 is detected to be faulty, repairing process can be performed to repair the electronic component 20. Alternatively, the electronic component 20 can be scrapped without performing subsequent BEOL processes and package processes, in order to save manufacturing costs.

In some embodiments of the present disclosure, the electrical testing component 30 can be selectively enabled to create an electrical connection to the underlying bottom plate 22 of the electronic component 20. The electrical testing component 30 allows the electronic component 20 to be tested in advance before the through vias are formed during BEOL processes. Therefore, a repairing process can be performed to repair the electronic component 20 if the electronic component 20 is detected to be faulty. Alternatively, the electronic component 20 can be scrapped without performing subsequent BEOL processes and package processes. In either case, the manufacturing costs of the electronic device 1 can be reduced.

In contrast, with conventional integrated circuit fabrication methods, the electronic device cannot be tested until the through vias are formed during BEOL processes. After the BEOL processes are completed, it is difficult to repair the electronic component. Accordingly, the manufacturing costs are increased.

One aspect of the present disclosure provides an electronic device. The electronic device includes a substrate, an electronic component disposed over the substrate and an electrical testing component disposed over the substrate. The electronic component includes a bottom plate over the substrate and a top plate over the bottom plate. The electrical testing component is fusible in order to be selectively electrically connected to the bottom plate of the electronic component.

One aspect of the present disclosure provides an electric testing method. The electric testing method includes the following processes. An electronic device is provided. The electronic device includes an electronic component and an electrical testing component. The electronic component includes a bottom plate, and a top plate over the bottom plate. The electrical testing component includes a first anti-fuse structure and a second anti-fuse structure. A first voltage is applied to the first anti-fuse structure and a second voltage is applied to the second anti-fuse structure in order to electrically connect the first anti-fuse structure and the second anti-fuse structure to the bottom plate. The electronic component is tested by applying a third voltage to one of the first anti-fuse structure and the second anti-fuse structure and a fourth voltage to the top plate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
    a substrate;
    an electronic component disposed over the substrate, wherein the electronic component comprises:
    a bottom plate over the substrate; and
    a top plate over the bottom plate; and
    an electrical testing component disposed over the substrate,
    wherein the electrical testing component is fusible in order to be selectively electrically connected to the bottom plate of the electronic component;
    wherein the electrical testing component comprises a first anti-fuse structure and a second anti-fuse structure, and the first anti-fuse structure and the second anti-fuse structure are fusible in order to be electrically connected to the bottom plate;
    wherein the electronic component further comprises a dielectric layer between the bottom plate and the top plate, and a plurality of capacitor electrodes in the dielectric layer, wherein the plurality of capacitor electrodes are electrically connected to the bottom plate and the top plate;
    wherein the first anti-fuse structure comprises:
        a first bottom electrode over the substrate and electrically connected to the bottom plate;
        a first top electrode penetrating the dielectric layer; and
        a first contact pad disposed over the dielectric layer and electrically connected to the first top electrode; and
    wherein the second anti-fuse structure comprises:
        a second bottom electrode over the substrate and electrically connected to the bottom plate;
        a second top electrode penetrating the dielectric layer; and
        a second contact pad disposed over the dielectric layer and electrically connected to the second top electrode.

2. The electronic device of claim 1, wherein the first bottom electrode of the first anti-fuse structure, the second bottom electrode of the second anti-fuse structure and the bottom plate of the electronic component are formed from a first conductive layer.

3. The electronic device of claim 1, wherein the first top electrode of the first anti-fuse structure, the second top electrode of the second anti-fuse structure, and the capacitor electrodes of the electronic component are formed from a second conductive layer.

4. The electronic device of claim 1, wherein the first contact pad of the first anti-fuse structure, the second contact pad of the second anti-fuse structure, and the top plate of the electronic component are formed from a third conductive layer.

5. The electronic device of claim 1, further comprising a dielectric film disposed between the bottom plate and the dielectric layer.

6. The electronic device of claim 5, wherein the dielectric film is ruptured such that the first top electrode is electrically connected to the first bottom electrode, and the second top electrode is electrically connected to the second bottom electrode.

7. An electric testing method, comprising:
    providing an electronic device, comprising:
        an electronic component, wherein the electronic component comprises:
            a bottom plate; and
            a top plate over the bottom plate; and
            an electrical testing component, comprising:
                a first anti-fuse structure; and
                a second anti-fuse structure;
    applying a first voltage to the first anti-fuse structure and a second voltage to the second anti-fuse structure, in order to electrically connect the first anti-fuse structure and the second anti-fuse structure to the bottom plate; and
    testing the electronic component by applying a third voltage to one of the first anti-fuse structure and the second anti-fuse structure and a fourth voltage to the top plate.

* * * * *